US006563076B1

(12) United States Patent
Benjamin et al.

(10) Patent No.: US 6,563,076 B1
(45) Date of Patent: May 13, 2003

(54) VOLTAGE CONTROL SENSOR AND CONTROL INTERFACE FOR RADIO FREQUENCY POWER REGULATION IN A PLASMA REACTOR

(75) Inventors: Neil Benjamin, Palo Alto, CA (US); Scott Baldwin, San Jose, CA (US); Seyed Jafar Jafarian-Tehrani, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/557,745

(22) Filed: Apr. 25, 2000

Related U.S. Application Data

(63) Continuation of application No. 09/410,183, filed on Sep. 30, 1999, now abandoned.

(51) Int. Cl.[7] ............................................... B23K 10/00
(52) U.S. Cl. ......................... 219/121.54; 219/121.43; 219/121.58; 118/723 I; 156/345
(58) Field of Search ...................... 219/121.54, 121.57, 219/121.4, 121.43, 121.44, 121.58; 315/111.51, 111.37; 156/345; 118/723 I, 723 R

(56) References Cited

U.S. PATENT DOCUMENTS 6,060,837 A * 5/2000 Richardson et al. .... 315/111.51
6,252,354 B1 * 6/2001 Collins et al. .......... 315/111.51

* cited by examiner

*Primary Examiner*—Mark Paschall
(74) *Attorney, Agent, or Firm*—Martine & Penilla, LLP

(57) ABSTRACT

A plasma reactor system with controlled DC bias for manufacturing semiconductor wafers and the like. The reactor system includes a plasma chamber, a plasma generating coil and a chuck including a chuck electrode. The chuck supports a workpiece within the chamber. The plasma reactor system further includes a pair of generators, one of which supplies a radio frequency signal to the plasma generating coil. The second generator delivers a RF signal which to the chuck electrode and acts to control DC bias at the workpiece. Peak voltage sensor circuitry and set point signal circuitry controls the power output of the generator, and a matching network coupled between the generator and the first electrode matches the impedance of the RF signal with the load applied by the plasma. DC bias determines the energy with which plasma particles impact the surface of a workpiece and thereby determines the rate at which the process is performed. This DC bias forms at the surface of the workpiece upon generation of a plasma in the plasma chamber and is affected by the RF signal applied to the chuck electrode. Since power losses within the match network are variable and unpredictable, the peak voltage at the electrode can not be consistently maintained by simply applying a predetermined generator output. By monitoring the peak voltage at the electrode and generating a corresponding control signal to control the generator, a consistent DC bias and corresponding process rate can be maintained.

41 Claims, 9 Drawing Sheets

VOLTAGE CONTROL SENSOR AND CONTROL INTERFACE FOR RADIO FREQUENCY POWER REGULATION IN A PLASMA REACTOR

This is a continuation of Ser. No. 09/410,183, filed Sep. 30, 1999, now abandoned.

BACKGROUND OF THE INVENTION

1. Field of the Invention

The present invention relates to plasma processing systems and, more particularly, to methods and apparatus for controlling radio frequency delivery in a plasma reactor through monitoring and feedback of an electrical parameter, in particular a peak voltage.

2. Background Art

Ionized gas, or plasma, is commonly used during the processing and fabrication of semiconductor devices. For example, plasma can be used to etch or remove material from semiconductor integrated circuit wafers, and to sputter or deposit material onto semiconducting, conducting or insulating surfaces.

With reference to FIG. 1A, creating a plasma for use in manufacturing or fabrication processes typically begins by introducing various process gases into a plasma chamber 10 of a plasma reactor, generally designated 12. These gases enter the chamber 10 through an inlet 13 and exit through an outlet 15. A workpiece 14, such as an integrated circuit wafer is disposed in the chamber 10 held upon a chuck 16. The reactor 12 also includes plasma density production mechanism 18 (e.g. a TCP coil). A plasma inducing signal, supplied by a plasma inducing power supply 20 is applied to the plasma density production mechanism 18. the plasma inducing signal is preferably a radio frequency (RF) signal. A dielectric window 22, constructed of a material such as ceramic, incorporated into the upper surface of the chamber 10 allows efficient transmission of the first RF signal from the TCP coil 18 to the interior of the grounded chamber 10. This first RF signal excites the gas molecules within the chamber, generating a plasma 24.

The plasma 24 formed within the chamber 10 includes electrons and positively charged particles. The electrons, being lighter than the positively charged particles tend to migrate more readily, causing a sheath to form at the surfaces of the chamber 10. A self biasing effect causes a net negative charge at the inner surfaces of the chamber. This net negative charge, or D.C. sheath potential acts to attract the heavier positively charged particles toward the wall surfaces. The strength of this D.C. bias in the location of the workpiece 14 largely determines the energy with which the positively charged particles will strike the workpiece 14 and correspondingly affects the desired process (e.g. etch rate, or deposition rate).

The present invention will be more readily understood by bearing in mind the distinction between DC bias and DC sheath potential. DC bias is defined as the difference in electrical potential between a surface within the chamber 10 and ground. DC sheath, on the other hand is defined as the difference between the plasma potential and the potential of a surface within the chamber as measured across the plasma sheath.

The workpiece is held upon a chuck 16 is located at the bottom of the chamber 10 and constitutes a chuck electrode 26. A bias RF power source 28 supplies a biasing RF signal to the chuck electrode 16. Alternatively, in some systems the both the plasma density signal and bias signal are in fact a single signal produced by a single power source.

This second excitation signal, preferably in the form of a RF signal, at the second electrode increases the DC bias at the location of the workpiece, depending on the disposition of the RF electric field within the chamber 10, and this increases the energy with which the charged particles strike the workpiece. Variations in the RF signal supplied to the second electrode 16 produce corresponding variations in the D.C. bias at the workpiece affecting the process.

With continued reference to FIG. 1A, the bias RF power source 28 described above supplies a R.F. signal to the chuck electrode 26. This signal passes through a match network 30 disposed between the bias RF power source 28 and the chuck electrode 26. The match network 30 matches the impedance of the RF signal with the load exhibited by the plasma. A similar match network 31 is provided between the power inducing power source 20 and the TCP coil 18. As discussed above, the control and delivery of the RF signal at the chuck electrode 26 is of fundamental importance in plasma processing. Significant variance in actual power delivered may unexpectedly change the rate of the process. Unfortunately, the match network 30 generates significant losses in the RF signal. Furthermore, these losses are variable and, to a degree, unpredictable. Therefore, simply supplying a predetermined RF signal power from the RF power source 28 does not ensure that a predictable and consistent RF signal will be delivered at the electrode 26.

With continued reference to FIG. 1A, one method which has been used to attach the workpiece 14 to the chuck 16 has been to provide the chuck with clamps 32 which contact the surface of the workpiece along its edges to hold the workpiece to the chuck. Using such a chuck 16 (and to the extent that the workpiece is somewhat conductive) it is possible to measure the D.C. bias directly by installing a pickup 33 at the electrode 26 and transmitting a voltage signal to a voltage sensor 34. The power source could then be feedback controlled to maintain a constant measured D.C. bias. However, using such clamps 32 to attach the workpiece 14 to the chuck 16 presents multiple problems. For one, valuable surface area may be wasted on the workpiece due to its engagement with the clamps 32. In addition, any such contact of clamps 32 to the workpiece 14 is undesirable due the risk of damage to the workpiece 14, and the generation of particles.

With reference to FIG. 1B, another method which has been used to hold the workpiece onto the electrode has been to provide an electrode in the form of an electrostatic chuck 36. In its most general sense an electrostatic chuck includes an electrode 38 which is covered with an insulator 40. The electrically conductive workpiece 14, which is generally semiconductive, sits on the electrically insulating material. When a DC voltage is applied to the electrode 38, the electrode and workpiece 14 become capacitively coupled resulting in opposite electrical charges on each, attracting the workpiece 14 and electrode 38 toward one another. This acts to hold the workpiece against the chuck 36.

More particularly, the electrostatic chuck 36 can be understood with reference to FIG. 1C in addition to FIG. 1B. In this bipolar implementation, the electrode 38 of the electrostatic chuck 36 includes first and second electrically conducive portions 42 and 44, which are electrically isolated from one another. A DC voltage from a D.C. voltage source 46, passes through a filter 47 before being applied between the first and second portions 42 and 44 of the electrode 38. This causes the desired electrostatic attraction between the electrode 38 and the workpiece 14, thereby holding the workpiece to the chuck 36.

With reference to FIG. 1D, a simpler version of electrostatic chuck is illustrated. This simpler form of electrostatic chuck, termed a mono polar chuck 37 is shown in plan view in 1D. By applying a DC potential between the workpiece 14 and the chuck an electrostatic charge on each holds the workpiece to the chuck. It will be appreciated by those skilled in the art that numerous other forms of electrostatic chuck are possible as well.

However, use of such an electrostatic chuck 36 renders a direct measurement of the D.C. bias at the workpiece impractical. End users are averse to having their sensitive semiconductor products touched by any mechanical probe or electrically conductive item such as a voltage sensor. In addition, it would be difficult to maintain sensor accuracy and longevity in the plasma environment. Correlating the D.C. voltage by measuring the power of the RF signal at the electrode 16 is also difficult and does not provide an accurate measurement of the D.C. sheath potential due, in part, to the capacitive coupling between the electrode and the workpiece.

Therefore, there remains a need for system for controlling R.F. power at an electrode to maintain a consistent D.C. sheath potential. Such a system would preferably not involve contact with a workpiece, would not require placing a sensor with the plasma environment of the plasma chamber, and would account for variable and unpredictable power losses through a match network.

SUMMARY OF THE INVENTION

The present invention provides a plasma reactor having a chamber and a chuck supporting a workpiece within the chamber. The chuck includes a chuck electrode which receives a bias radio frequency (RF) signal from a bias RF power source. The RF signal at the electrode affects the plasma, and more particularly affects the DC bias. A sensor measures a parameter of the plasma, such as for example the peak voltage of the RF signal delivered to the electrode which is compared with the desired set point and from which an error signal is derived. The error signal is then amplified and used to control the RF power source.

Typically, a match network, located between the bias RF power source and the chuck, matches the impedance of the plasma load to that of the output (typically 50 Ohms) of the RF power source. The maintenance of a consistent RF signal at the electrode is of importance in maintaining a consistent DC bias at the workpiece and a correspondingly consistent process. For instance the RF delivery system is subject to losses such that process results may not be predictable and constant. For example, the match network generates substantial power losses in the RF signal, these losses being variable and, to an extent, unpredictable. By sensing the RF peak voltage near the electrode and using that sensed voltage to generate a corresponding error signal to control the power supply, a consistent D.C. bias can be maintained at the workpiece in spite of the variation in transmission, such as for example those generated by the match network.

More particularly, the present invention is preferably embodied in an inductive plasma reactor having a Transformer Coupled Plasma (TCP) reactor coil. This coil can be located outside of the plasma chamber and is separated from the plasma by a ceramic window, provided in wall of the chamber. A plasma generating RF source supplies a RF signal to the TCP coil. A gas flows through the chamber, and is ionized by RF current induced from the TCP coil. The RF current is coupled to the plasma primarily by magnetic induction through a dielectric window. The fundamental purpose of the TCP coil and the signal supplied thereto is to generate plasma density.

As the plasma is formed, the electrons, which tend to migrate more easily than the positive ions, develop a net negative charge on the at the inner surfaces of the chamber as well as at the workpiece supported upon the chuck. This net charge generates a DC bias which determines the energy with which the positively charged particles strike the surface of the workpiece and thereby is a primary factor in determining the process results.

A pickup connected to the electrode receives the RF signal delivered to the electrode. This signal is then passed through a lead wire to the RF sensor which is located as close to the chuck electrode as is possible without risking arcing between the sensor and the chuck electrode. Placing the sensor close to the electrod minimizes the length of lead wire necessary to transmit the RF signal to the sensor, thereby minimizing inductive and resistive affects of the lead wire upon the signal.

Within the sensor, the RF signal is divided and separated into AC and DC components. If desired, the DC component can be used to monitor electrostatic chuck function. However that is not a necessary component of the present invention. The AC signal component then passes through a surge protection circuit before being fed to a balanced detector circuit. The balanced circuit ensures that the AC signal is symmetrically loaded about the zero volt axis, ensuring that the signal does not generate a spurious DC component which would induce error into the system. The AC signal is then passed through an amplifier circuit which includes a feedback circuit and incorporating retification and peak hold circuitry to yield a DC equivalent of the RF peak voltage. Matched diodes in both arms of the amplifier circuit, together with the diode in the balance circuit, ensure that any non-linearity is largely compensated or in the DC equivalent signal at the output of the amplifier.

This DC equivalent signal is then passed through a differential buffer and an amplifier with gain and offset adjustment before being delivered as an output signal. This same signal is then compared with the desired setpoint to derive an error signal which is passed through a high gain amp and through a power limit circuit which protects the electrode from being damaged by a surge. The signal passes to the generator to provide a RF generator as a command to control the power produced.

Alternatively the present invention can be used with a capacitively coupled plasma reactor. In such an electrode capacitively coupled with the chuck electrode replaces the TCP coil described above. In addition, the present invention can be used with a mechanical chuck rather than an electrostatic chuck obviating the need to place a sensor within the plasma environment.

By detecting the RF peak voltage delivered at the electrode, the present invention accurately and efficiently controls the RF signal delivered to the chuck elecrode, allowing a consistent DC bias to be maintained. In this way, the plasma reactor can consistently produce high quality uniform workpieces.

While the invention has been described in terms of using RF peak voltages delivered to the electrode, it should be appreciated that other process parameters can be monitored as well and used in a feedback system to control the process. By way of example, the current supplied to the coil could be monitored and used in a feedback system.

These and other advantages of the present invention will become apparent to those skilled in the art upon a reading of the following descriptions of the invention and a study of the several figures of the drawings.

BRIEF DESCRIPTION OF THE DRAWINGS

The present invention will be readily understood by the following detailed description in conjunction with the accompanying drawings, with like reference numerals designating like elements.

DETAILED DESCRIPTION OF THE PREFERED EMBODIMENTS

Figure 1A:
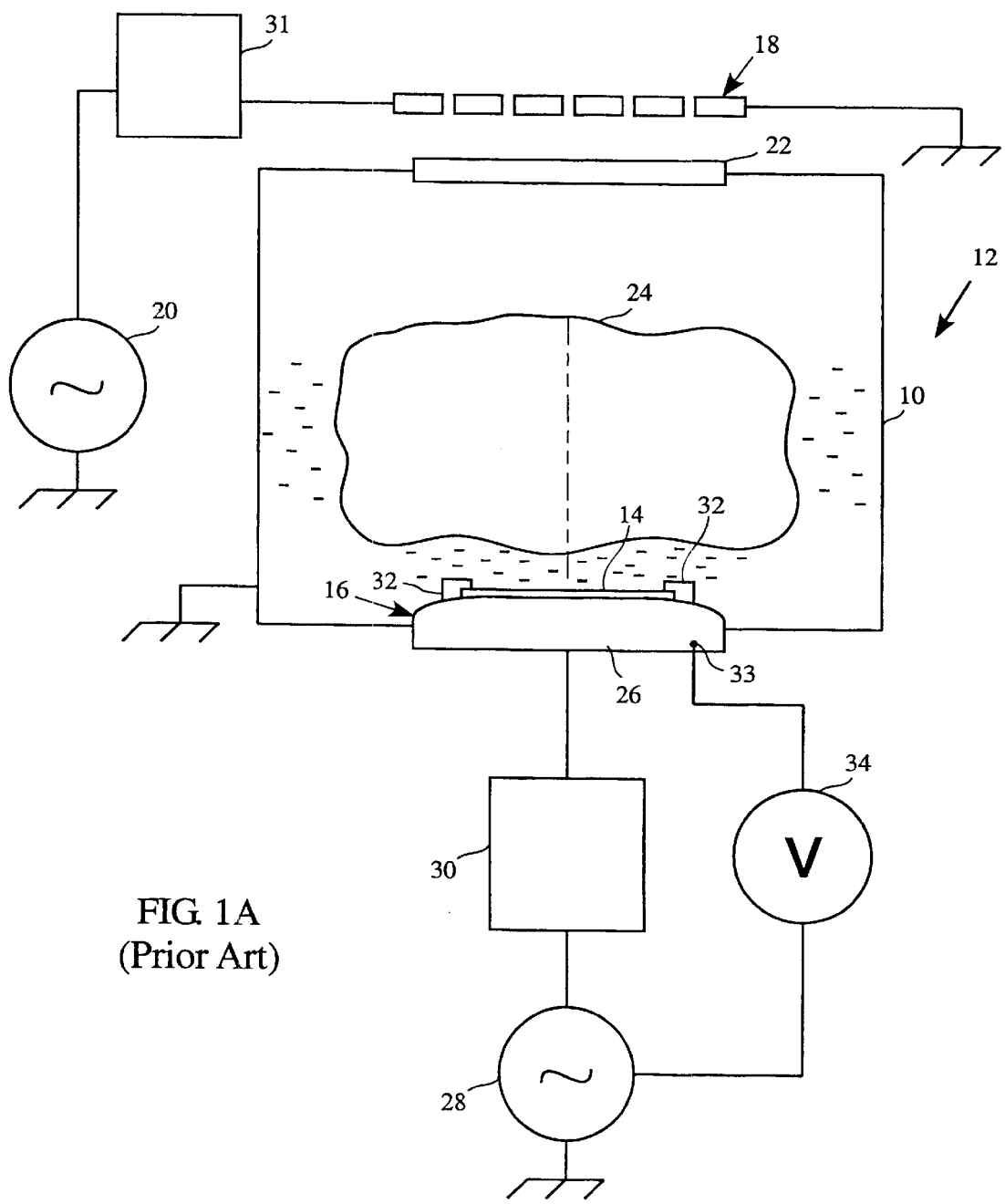
FIG. 1A is a schematic diagram of a plasma reactor system of the prior art.
Figure 1B:
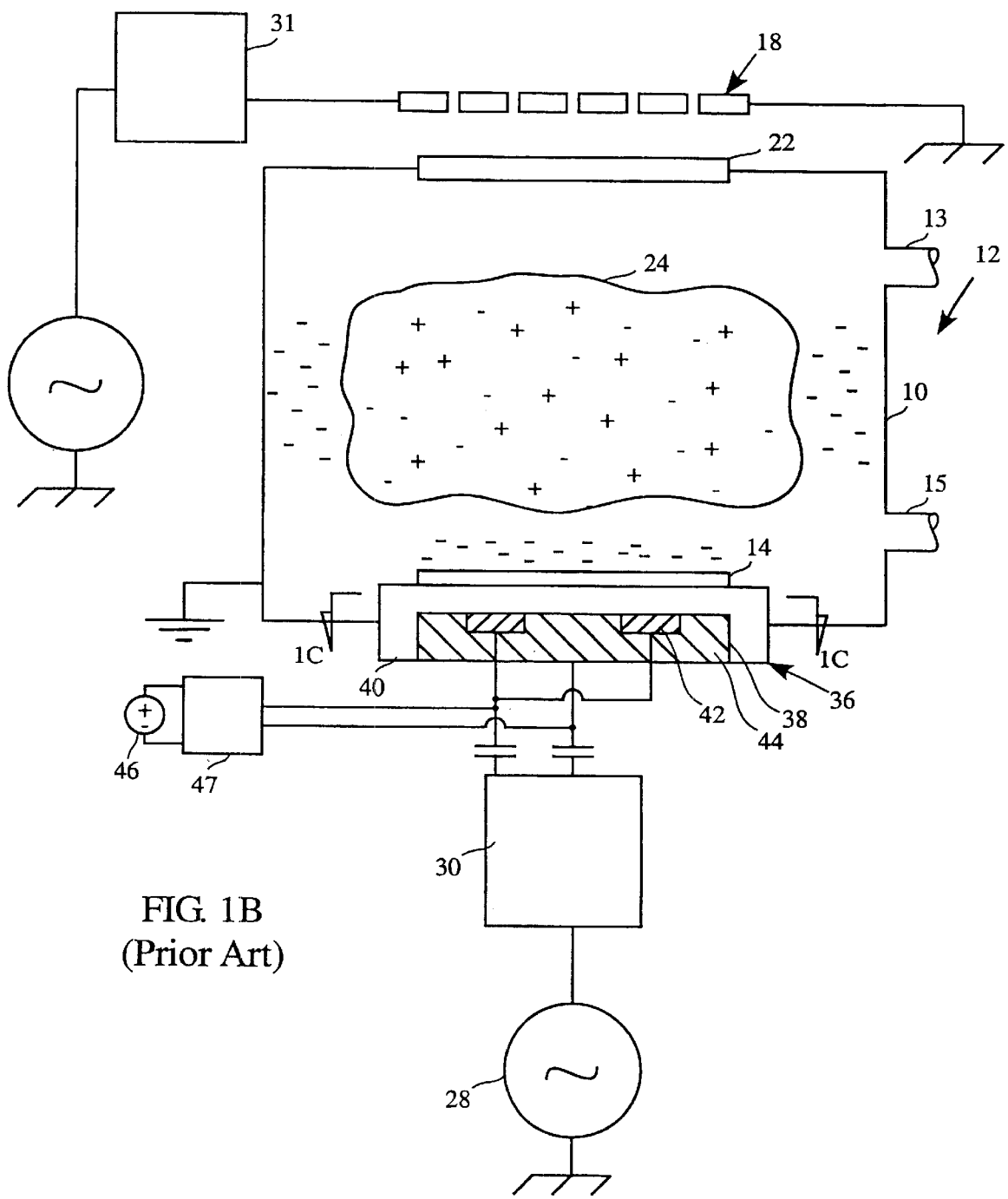
FIG. 1B is a schematic diagram of another plasma reactor of the prior art.
Figure 1C:
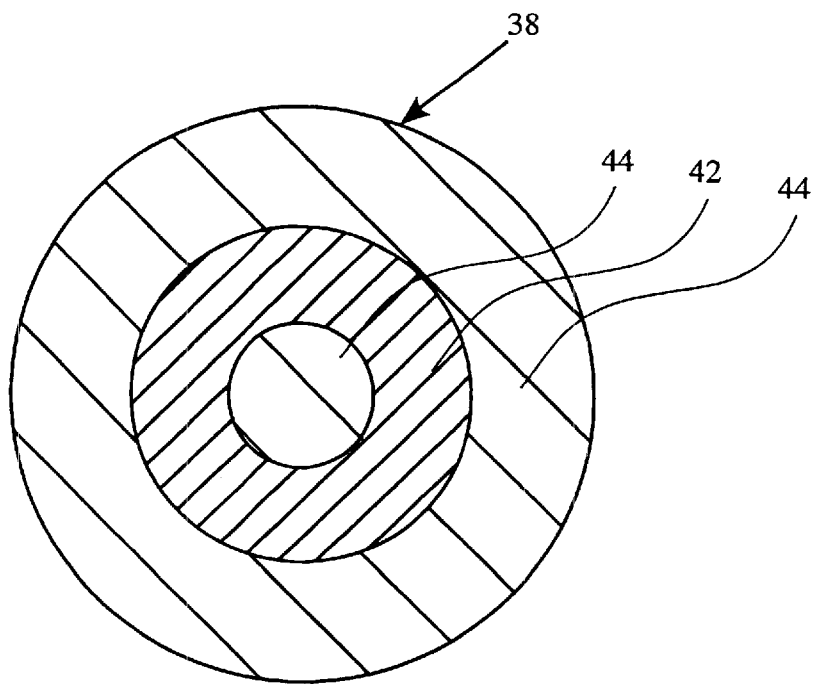
FIG. 1C is an expanded view, taken from line 1C—1C of FIG. 1B, of an electrostatic chuck of the prior art.
Figure 1D:
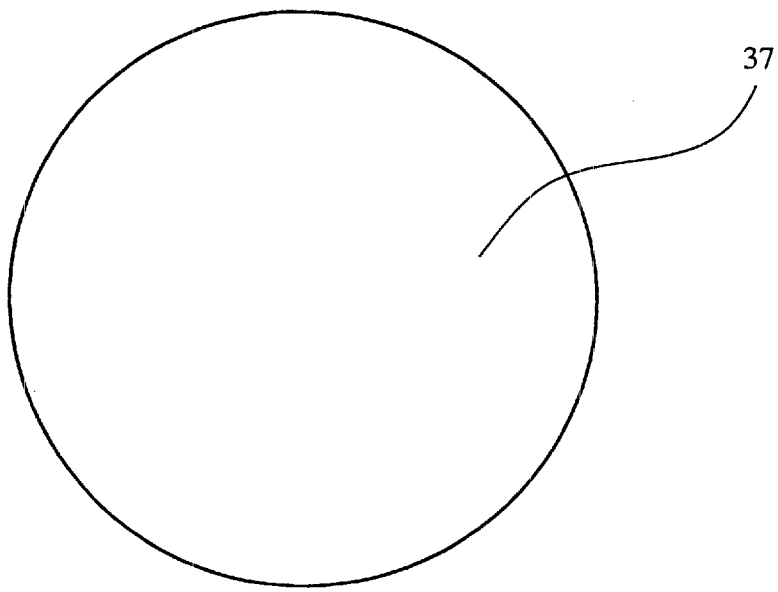

FIGS. 1A, 1B and 1C have been discussed with reference to the background art.

Figure 2A:
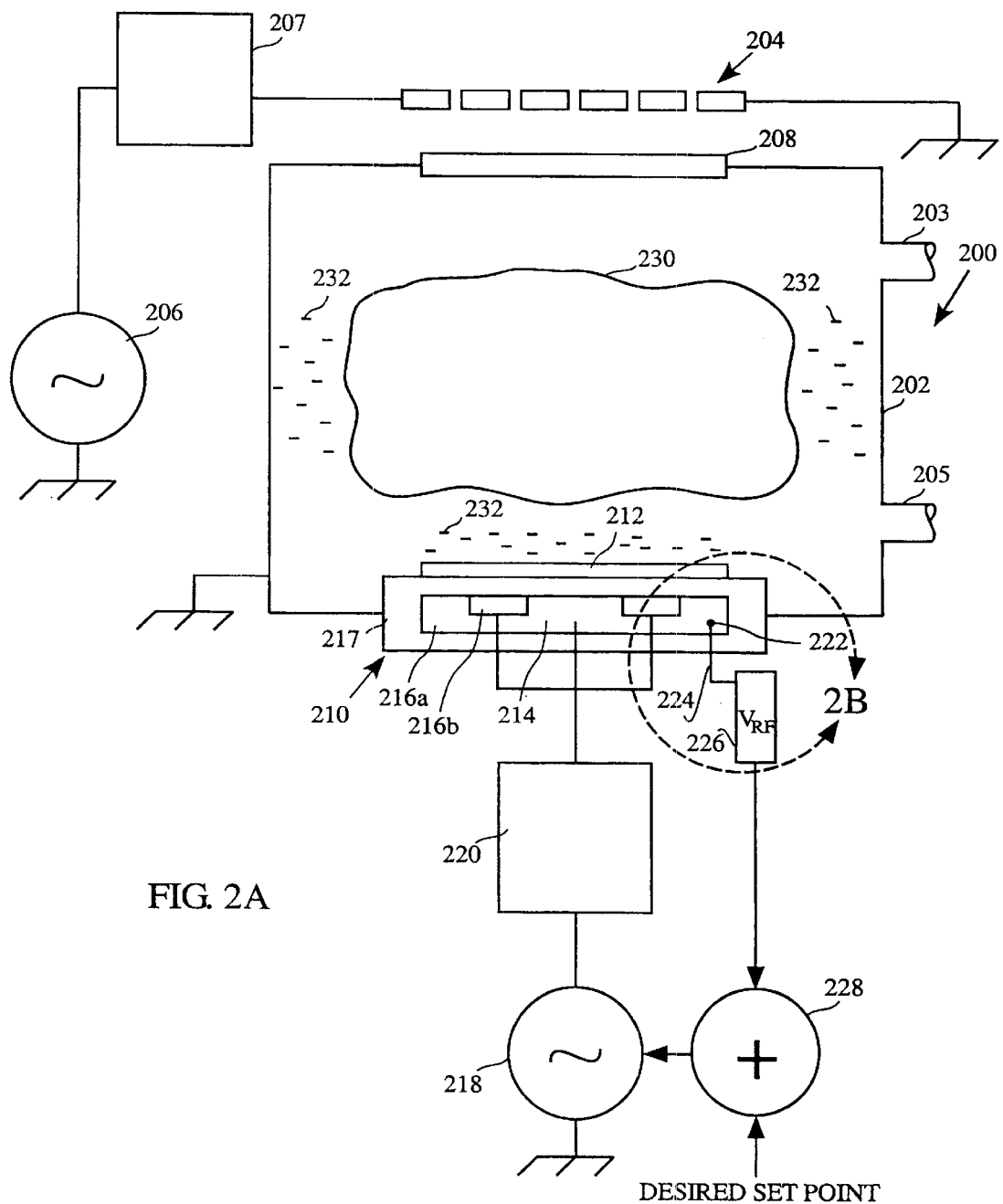
FIG. 2A is a schematic view of a plasma reactor system of the present invention.

With reference to FIG. 2A, the present invention is embodied in a plasma reactor system, generally referred to as 200. The plasma reactor 200 includes a plasma chamber 202 and a Transformer Coupled Plasma (TCP) coil 204 disposed outside and above the plasma chamber 202. The plasma chamber 202 further includes a gas inlet 203 and a gas outlet 205. The TCP coil 204 is coupled with a plasma generation power source 206 which provides a plasma generating Radio Frequency (RF) signal. A match network 207 is included between the plasma generation power source 206 and the TCP coil 204. A ceramic window 208 located adjacent the TCP coil 204 in the upper wall of the chamber 202 allows efficient transmission of the plasma generating RF signal into the plasma chamber 202. An electrostatic chuck 210, located at the bottom of the chamber 202, supports a workpiece 212.

With continued reference to FIG. 2A, the electrostatic chuck includes a chuck electrode 214. The chuck electrode 214 includes a first and second electrically conductive portions 216a and 216b which are electrically isolated from one another. The chuck electrode 214 is surrounded by an electrical insulator 217. By applying a DC voltage across the conductive portions, as discussed in the prior art, an electrostatic coupling is created between the portions 216a and 216b and the workpiece 212. This coupling attracts the workpiece 212 holding it fast against the chuck 210.

A bias RF power source 218 is coupled with a match network 220 which is further coupled with the chuck electrode 214. A pickup 222 extends into the chuck 210 electrically connecting with the chuck electrode 214. This pickup 222 is coupled via a lead wire 224 with a RF peak voltage sensor 226. This RF peak voltage sensor generates a monitor signal which is combined with the set point in summing circuitry 228 to generate a control signal which may optionally then be used to control the bias generating power source 218.

In operation, a gas capable of ionization flows into the chamber 202 through the gas inlet 203 and exits the chamber through the gas outlet 205. A plasma generating RF signal is produced by the RF power source 206 and is delivered to the TCP coil 204. This plasma generating RF signal radiates from the coil 204 through the window 208 and into the chamber 202, where it causes the gas within the chamber 202 to ionize and form a plasma 230 within the chamber.

With further reference to FIG. 2A, the plasma produces a sheath 232 along the walls of the chamber 202. The plasma generated within the chamber 202 includes electrons and positively charged particles. The electrons, being much lighter than the positively charged ions, tend to migrate more readily, generating a DC sheath potential at the surfaces of the chamber 202. This sheath potential being negative tends to attract the positively charged ions and repels further electrons, thus containing them. The average DC sheath potential at the location of the workpiece 212 predominantly determines the energy with which the positively ions strike the workpiece, and therefore a primary determinant of process parameters. For instance it will affect the rate at which etching or deposition take place.

The amount of DC bias at the workpiece, and corresponding process conditions, can be altered, e.g. the rate increased, by applying an RF signal to the chuck electrode. To this end, a RF signal is generated by the RF power source 218. This RF signal passes then passes through the match network 220 which matches the impedance of the RF generator, typically 50Ω, to that presented by the plasma load 230. This matched signal then passes to the chuck electrode 214, which being capacitively coupled with the workpiece, passes the signal to the workpiece through the insulator 217 of the chuck 210.

Figure 2B:
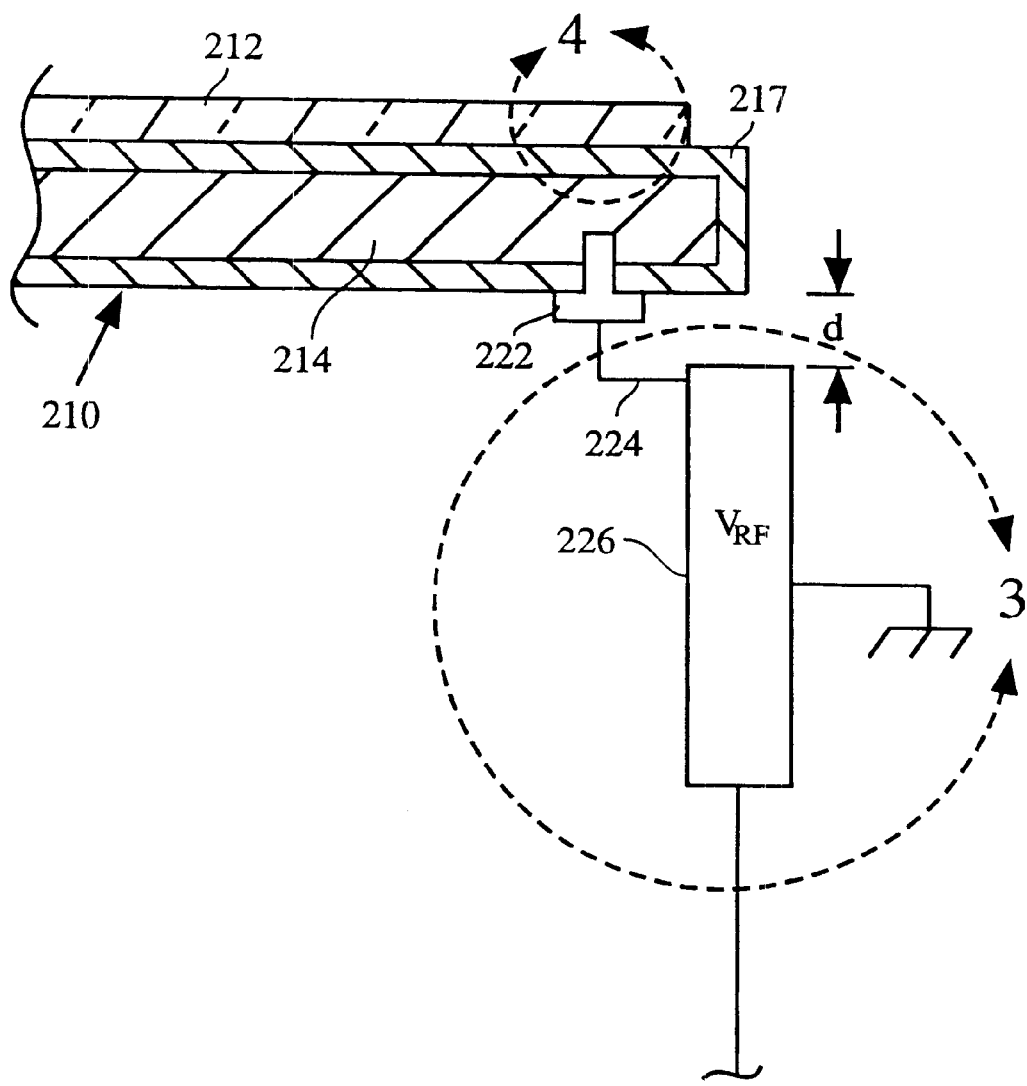
FIG. 2B is a view, shown enlarged, taken from area 2B of FIG. 2A.

With continued reference to FIG. 2A, substantial power losses may occur as the signal passes through the match network 220. Furthermore, as discussed in the Background of the Invention, these losses are variable and difficult to predict. In order to account for these variable and unpredictable power losses the pickup 222 collects the peak voltage of the RF signal at the chuck electrode and passes this voltage to the voltage sensor 226 through the lead wire 224. With reference to FIG. 2B the length of the lead wire should be as short as possible to minimize inductive and resistive effects on the transmission of the pickup signal, while at the same time providing sufficient distance "d" between the sensor 226 and the chuck 210 to prevent electrical arcing between the chuck and the sensor.

Figure 3:
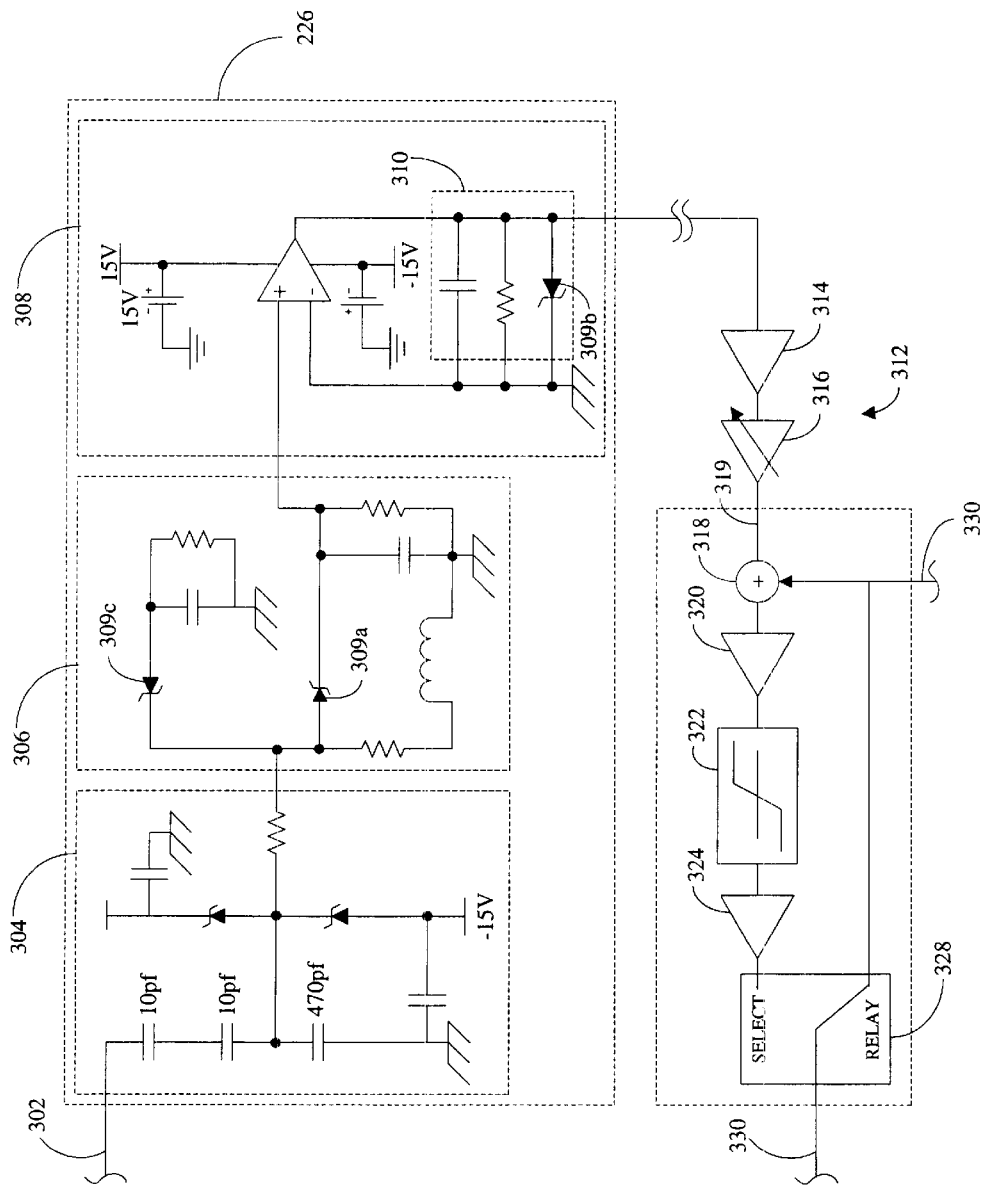
FIG. 3 is a schematic of circuitry within sensor 210 of FIG. 2B.

With reference to FIG. 3, the sensor circuitry 226 receives the RF signal from the lead wire 224 at an input 302. The sensor circuitry 226 contains both a DC divider for ESC clamp monitoring (unrelated to the present invention) and a separate AC divider with clamp protection circuitry 304 whose output is a fraction of the incoming RF, which is then sent on to a balancing circuit 306. The balancing circuit ensures that the RF signal is symmetrically balanced about the zero volt axis, preventing DC offset errors from being introduced into the system. The balanced ac signal is then passed to an amplifier circuit 308 which includes rectification and feedback circuitry which converts the RF signal into a DC signal equivalent to the RF peak value. Matched diodes, 309a, 309b and 309c, are included in the balancing/rectification circuit 306 and feedback loop of the amplifier circuit 308. The matched diodes 309a and 309b are manufactured on the same chip to have exactly the same performance characteristics as one another, and with 309c, act to ensure that any losses in the balance circuit will not affect the DC signal produced by the amplifier circuit 308.

The DC monitor signal produced by the sensor circuitry provides an accurate indication of the RF peak value at the electrode 214. With continuing reference to FIG. 3, this DC monitor signal then is passed to a differential ground compensating buffer amplifier 314 and then through a gain and offset adjustment stage 316 which outputs a DC signal 319 suitably scaled representing the RF peak value at the electrode 214. This DC output signal 319 is summed in appropriate phase with a DC set point command signal 330, thus generating an error signal for feedback control 318. The control signal 318 then passes through a high gain amp 320 and a power limit circuit 322. The power limit circuit prevents damage to the system by preventing a power-surge when the bias power source 218 is switched to voltage control, or whenever the voltage control loop becomes incomplete for any reason. The signal then passes through a final filter/buffer amp 324 and then to the power source 218 in the form of a RF generator command signal. A series relay controlled switch 328 allows the generator command signal 326 to be controlled either by the feedback circuitry as described or by using the command signal 330 as a simple power set point if desired.

Figure 6:
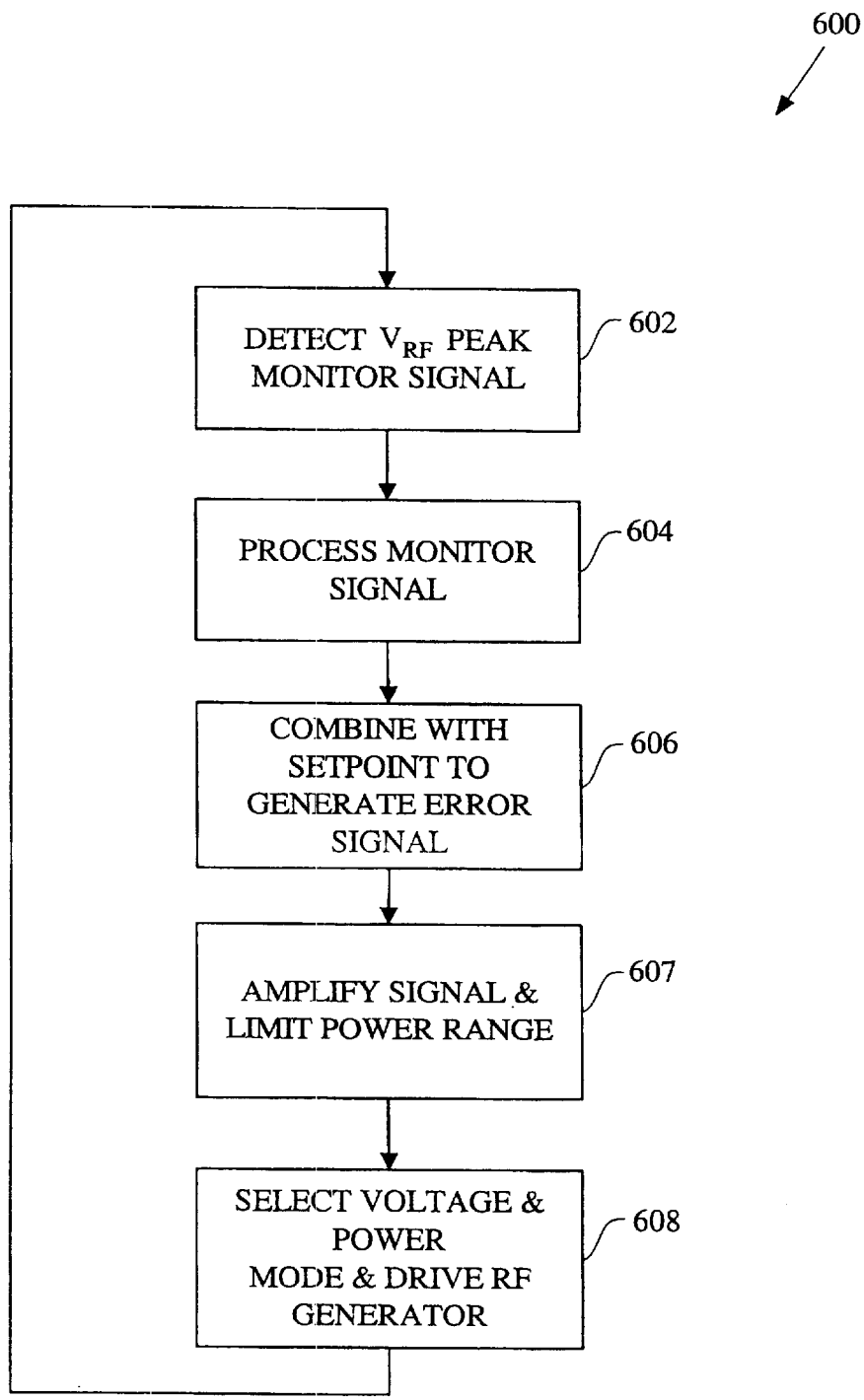
FIG. 6 is a process diagram of a method of controlling RF signal generation according to the present invention

With reference to FIG. 6, the circuitry 226 operates according to a process 600, which begins with a step 602 of detecting a peak RF voltage. Then, in a step 604, the DC representation of the RF peak voltage signal is processed for ground restoration, gain and offset to yield a monitor signal 319. In a step 606 the monitor signal 319 is summed in appropriate phase with a command setpoint signal 330, to generate an error signal 318. In a step 607, the error signal 318 is further amplified and then limited to a safe level for output as the generator command signal. Finally, in a step 608, after selection of direct power or voltage feedback mode, the power source 218 is driven according to the direct or modified command signal respectively. As illustrated in FIG. 6, the method 600 when conducted in a negative feedback control fashion acts to maintain a desired sensed parameter, in this instance peak RF voltage applied at the chuck.

Figure 4:
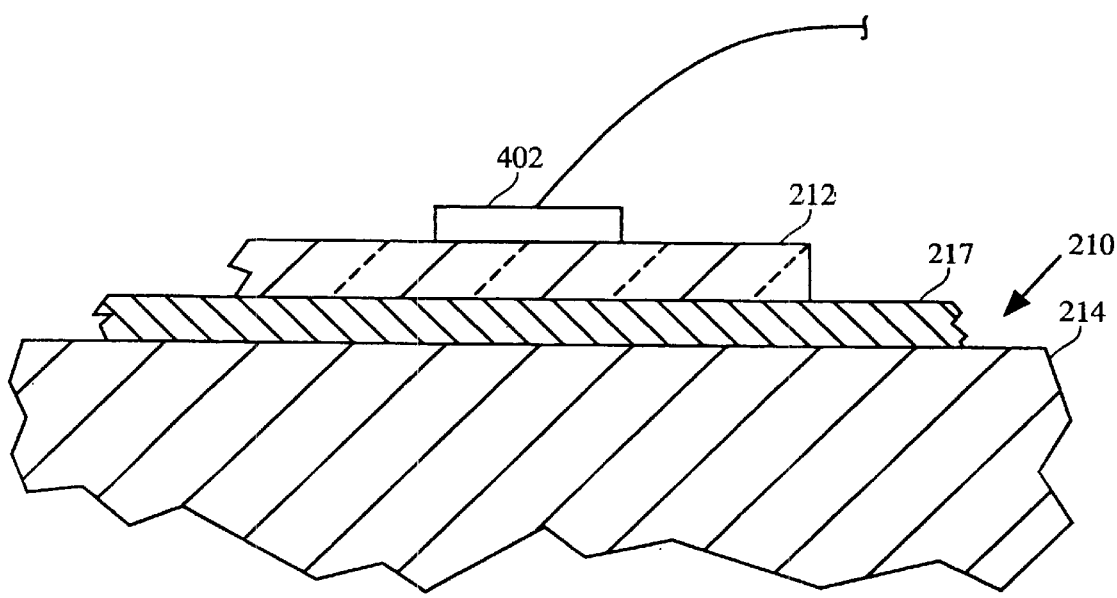
FIG. 4 is a view taken from area 4 of FIG. 2B of the present invention in calibration mode.
Figure 5:
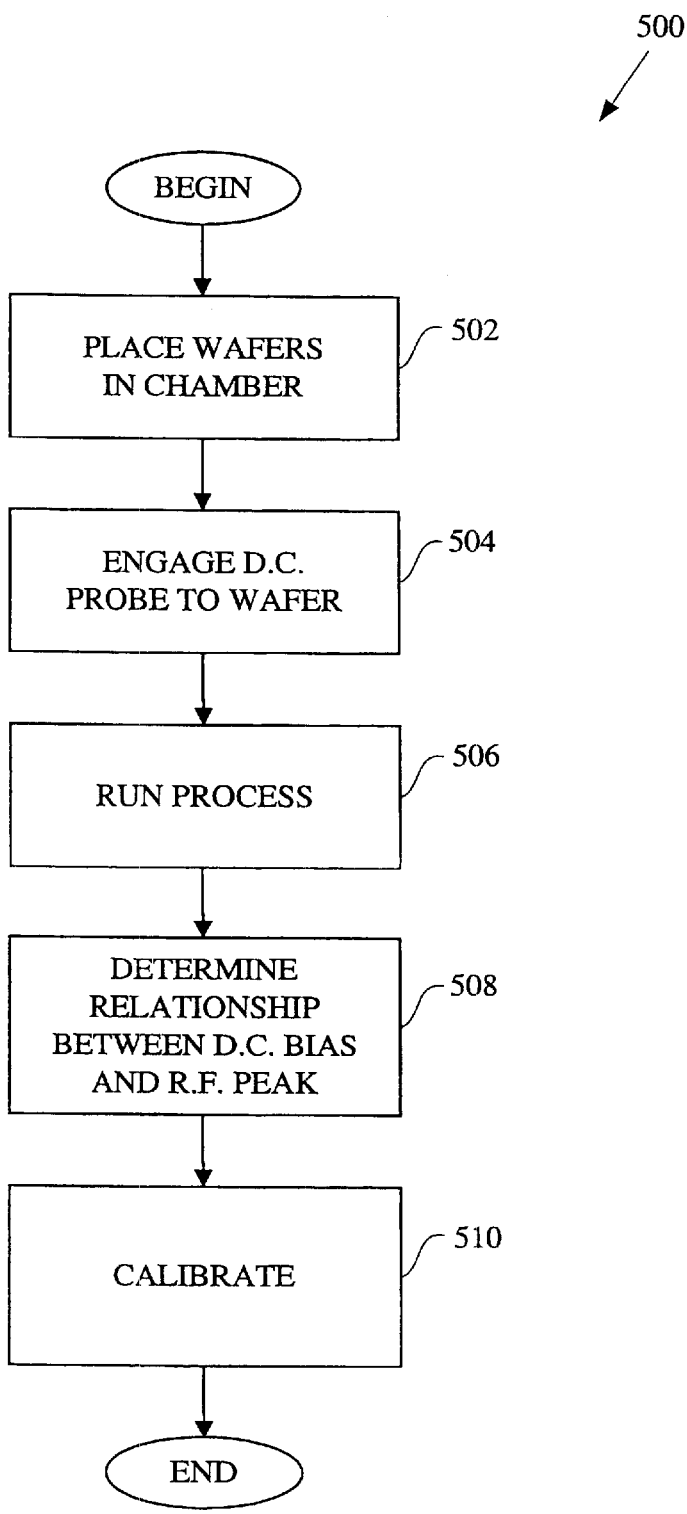
FIG. 5 is a process diagram of a method of calibrating the plasma reactor of the present invention.

With reference to FIGS. 4 and 5, in order to determine the relationship between bias voltage at the workpiece 212 and the peak voltage of the delivered signal, the plasma reactor system 200 must first be calibrated. FIG. 5, illustrates a process 500 for calibrating the reactor system 200. The process 500 begins with a step 502 in which a workpiece is placed into the chamber in the usual manner. The wafer used for calibration should be expendable, somewhat conductive and not intended for production, for reasons which will become apparent. In a step 504, an electrical probe 402 (FIG. 4) is engaged to the upper surface of the workpiece 212. Attaching the probe directly to the upper surface of the workpiece allows a direct measurement of the RF induced DC self bias during operation of the plasma reactor 200. However, direct contact with the upper surface of the workpiece risks damaging the semiconductor workpiece, and for this reason the workpiece used should only be intended for calibration and not for production. Then, in a step 506, a plasma process is run, during which a DC bias will form at the workpiece 212. This DC bias can then be directly measured as detected by the probe, and correlated to the RF peak voltage measured as detected from the pickup 222. Then, in a step 508, the DC bias and RF peak values can be compared at several power settings and a relationship there between can be determined. Finally in a step 510, the plasma reactor system 200 is calibrated.

In use, the plasma reactor 200 can be set for automatic adjustment by generating an error signal 318 with sufficient amplification through amplifier 320, to maintain RF peak voltage at the electrode 214, by continuously adjusting the output of RF power source 218.

In an alternate embodiment of the invention, not shown, the plasma reactor uses capacitively coupled electrodes to generate a plasma within the chamber. This embodiment of the invention operates substantially similarly to the above described embodiment by detecting a peak RF voltage of a bias RF signal at a chuck electrode and feeding back a signal to the bias generating RF power source to control the bias RF signal. Similarly, with a suitable sensor another parameter such as delivered current or power could be chosen as the control parameter in the feedback scheme, although the relationship to the sheath bias would be different. In particular, the real part of the current would be related to plasma density.

In yet another embodiment of the invention, also not shown, a mechanical chuck holds the workpiece using clamps as described in the background of the invention. Again this embodiment of the invention would operate substantially similarly to the above described embodiments to maintain consistent plasma parameters by monitoring peak RF voltage at the chuck electrode and feeding back a control signal to the bias RF power source.

In summary, the present invention provides an effective and accurate way to perform a plasma process with a consistent and predicable DC bias. This consistent DC bias ensures that process parameters such as etch rate are predictable and consistent, resulting in higher quality semiconductor wafers and increased production yield.

While the invention has been described herein in terms of a preferred embodiment, other embodiments of the invention, including alternatives, modifications, permutations and equivalents of the embodiments described herein, will be apparent to those skilled in the art from consideration of the specification, study of the drawings, and practice of the invention. The embodiments and preferred features described above should be considered exemplary, with the invention being defined by the appended claims, which therefore include all such alternatives, modifications, permutations and equivalents as fall within the true spirit and scope of the present invention.

What is claimed is:

1. A plasma reactor system for use in the processing and manufacture of a workpiece, the plasma reactor system comprising:

a plasma chamber for containing a plasma therein and having an interior configured for support and plasma processing of the workpiece;

a workpiece support electrode disposed at least partially within said plasma chamber;

at least one variable power source supplying an electrical signal to said electrode; and feedback circuitry including:

a sensor circuit for sensing at least one parameter related to said plasma and generating an error signal corresponding to deviations in said parameter through use of a summing amplifier providing negative feedback control responsive to said deviations of said parameter wherein if the parameter related to said plasma is a second electrical signal, said second electrical signal is detected by a pickup, said pick-up being disposed at least partially within said electrode.

2. The plasma reactor of claim 1, wherein the at least one variable power source supplying an electrical signal to said electrode includes:
   a first variable power source supplying an electrical signal to said electrode, said first power source is capable of being the principle source bias in said plasma; and
   a second variable power source, said second power source being primarily for generation of said plasma.

3. A plasma reactor as recited in claim 1, wherein said parameter related to said plasma is an optical signal.

4. A plasma reactor as recited in claim 1 wherein said pickup is connected with said electrode.

5. A plasma reactor as recited in claim 1 wherein said parameter of said plasma is a power value of said electrical signal supplied to said electrode.

6. A plasma reactor as recited in claim 1 wherein said parameter of said plasma is a voltage value of said electrical signal supplied to said electrode.

7. A plasma reactor as recited in claim 1 wherein said parameter of said plasma is a peak voltage value of said electrical signal supplied to said electrode.

8. A plasma reactor as recited in claim 1 wherein said parameter is a current value of said signal supplied to said electrode.

9. A plasma reactor as recited in claim 1 wherein said parameter is a combination of complex voltage and current values of said electrical signal supplied to said electrode.

10. A plasma reactor as recited in claim 1 wherein said parameter of said plasma is a phase value of said electrical signal supplied to said electrode.

11. A plasma reactor as recited in claim 1 wherein said electrical signal is a radio frequency signal.

12. A plasma reactor system as recited in claim 1, wherein said electrical signal is a microwave signal.

13. A plasma system as recited in claim 11 wherein said radio frequency signal induces a direct current bias voltage across a plasma sheath at said electrode and wherein said peak voltage sensed by said sensor correlates to said direct current bias voltage.

14. A plasma reactor system as recited in claim 1 wherein said sensor circuitry is located outside of said chamber.

15. A plasma reactor system as recited in claim 1 wherein said sensor circuitry is as close coupled as possible with said pickup.

16. A plasma reactor system as recited in claim 1, further comprising a conduit coupled between said pickup and said sensor circuitry to transmit said signal therebetween.

17. A plasma reactor system as recited in claim 1 further comprising a match network connected between said power source and said electrode.

18. A plasma reactor system as recited in claim 17 wherein said sensor circuitry is coupled between said match network and said electrode.

19. A plasma reactor system as recited in claim 1 wherein said chamber is connected with and electrically insulated from said electrode.

20. A method for controlling power supplied to a plasma reactor, the plasma reactor being useful in the process and manufacture of a workpiece through reaction with a plasma contained therein, the method comprising:
   generating an electrical signal;
   delivering said signal to at least one electrode within the plasma reactor;
   generating an error signal corresponding to at least one parameter wherein if said at least one parameter is a second electrical signal, said second electrical signal is detected by a pickup, said pick-up being disposed at least partially within said at least one electrode; and
   controlling said power source based upon said error signal.

21. A method as recited in claim 20 wherein said parameter includes a voltage of said electrical signal.

22. A method as recited in claim 21 wherein said parameter includes a peak voltage of said electrical signal.

23. A method as recited in claim 20 wherein said parameter includes a power value of said electrical signal.

24. A method as recited in claim 20 wherein said parameter is a phase value of said electrical signal.

25. A method as recited in claim 20 wherein said parameter is a current value of said electrical signal.

26. A method as recited in claim 20 wherein said parameter is a combination of complex voltage and current of said electrical signal.

27. A method as recited in claim 20 wherein said parameter is an impedance of said electrical signal.

28. A method as recited in claim 20 wherein said parameter is an immittance of said electrical signal.

29. A method as recited in claim 20 further comprising the step of combining said error signal with a set point signal to generate a command signal capable of driving said power source.

30. A method as recited in claim 20 further comprising the step of matching a load presented by the plasma with said electrical signal.

31. A method as recited in claim 20 wherein said electrical signal is provided by a low impedance power source providing a signal which roughly matches the load presented by the plasma.

32. A method as recited in claim 20 wherein said signal is a radio frequency signal having a peak voltage and wherein said parameter is said peak voltage of said electrical signal.

33. A method as recited in claim 32 further comprising the step of generating a plasma, said plasma creating a DC bias which is correlated to said peak voltage of said radio frequency signal.

34. A method as recited in claim 22 wherein said peak voltage is detected from a pickup located at least partially within said electrode.

35. A method as recited in claim 32 wherein said step of generating an error signal includes the step of generating a DC signal which is a valid representation of said peak voltage of said radio frequency signal.

36. A method as recited in claim 20 wherein said step of controlling said power source is performed manually.

37. A method as recited in claim 20 wherein said step of controlling said power source is performed automatically.

38. A method for controlling power supplied to a plasma reactor, the plasma reactor being useful in the process and manufacture of a workpiece through reaction with a plasma contained therein, the method comprising:
   generating an electrical signal;
   supplying said electrical signal to a coil to thereby strike a plasma within the reactor;
   sensing at one parameter of said signal;
   generating an error signal corresponding to at least one parameter wherein if said at least one parameter is a second electrical signal, said second electrical signal is detected by a pickup, said pick-up being disposed at least partially within said at least one electrode; and
   controlling said power source based upon said error signal.

39. A method as recited in claim 38 wherein said parameter is a current.

40. A method as recited in claim 39 wherein said parameter is a voltage.

41. A method as recited in claim 40 wherein said parameter is a combination of complex current and voltage.

* * * * *